United States Patent [19]
Denham

[11] Patent Number: 5,959,445
[45] Date of Patent: *Sep. 28, 1999

[54] STATIC, HIGH-SENSITIVITY, FUSE-BASED STORAGE CELL

[75] Inventor: Martin S. Denham, Yamhill, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/002,174

[22] Filed: Dec. 31, 1997

Related U.S. Application Data

[63] Continuation-in-part of application No. 08/537,142, Sep. 29, 1995, Pat. No. 5,731,733.

[51] Int. Cl.[6] .............................. G05F 3/20; G11C 17/16

[52] U.S. Cl. ............................................ 323/315; 327/525

[58] Field of Search .............................. 323/315; 327/525

[56] References Cited

U.S. PATENT DOCUMENTS

| | | | |
|---|---|---|---|
| 4,608,530 | 8/1986 | Bacrania | 323/315 |
| 4,698,589 | 10/1987 | Blankenship, et al. | 324/158 |
| 4,730,129 | 3/1988 | Kunitoki, et al. | 307/362 |
| 4,837,520 | 6/1989 | Golke, et al. | 324/550 |
| 5,140,554 | 8/1992 | Schreck, et al. | 365/201 |
| 5,334,880 | 8/1994 | Abadeer, et al. | 307/219 |
| 5,384,746 | 1/1995 | Giolma | 365/225.7 |
| 5,418,487 | 5/1995 | Armstrong, II | 327/525 |
| 5,731,733 | 3/1998 | Denham | 327/525 |

Primary Examiner—Adolf Denske Berhane
Attorney, Agent, or Firm—Cindy T. Faatz

[57] ABSTRACT

A high-sensitivity fuse-based storage cell. A first circuit branch including a first fuse is coupled to a second circuit branch including a second fuse in a current mirror configuration. An output node is coupled to the first circuit branch and responsive to a sense enable signal to indicate a logical "1" if the first fuse is programmed and the second fuse is unprogrammed or a logical "0" if the first fuse is unprogrammed and the second fuse is programmed.

26 Claims, 4 Drawing Sheets

STATIC, HIGH-SENSITIVITY, FUSE-BASED STORAGE CELL

RELATED APPLICATIONS

This application is a continuation-in-part of U.S. patent application Ser. No. 08/537,142, entitled, "A Static, Low Current Sensing Circuit for Sensing the State of a Fuse Device," filed Sep. 29, 1995, now U.S. Pat. No. 5,731,733 (Attorney's Docket No. 42390.P3181).

FIELD OF THE INVENTION

The present invention pertains to the field of integrated circuit devices. More particularly, the present invention relates to a fuse-based storage cell.

BACKGROUND OF THE INVENTION

In integrated circuits including complementary metal oxide semiconductor (CMOS) integrated circuits, it is often desirable to be able to permanently store information, or to form permanent connections on the integrated circuit after it is manufactured. Fuses or other devices forming fusible links are frequently used for this purpose. Fuses can be used to program redundant elements to replace identical defective elements, for example. Fuses can also be used to store die identification or other information, or for other applications.

Fuse devices are selectively programmed to provide the capabilities described above. Where one or more fuses is used for information storage purposes, a sensing circuit is typically used to determine whether an associated fuse has been programmed or not, i.e. a sensing circuit is used to determine the value "stored". Sensing circuits operate to distinguish between programmed and unprogrammed (or burned and un-burned) fuses, usually by detecting a change in the resistance of the fuse device from a low to a high value.

Advances in process technology have introduced some new issues with respect to sensing the states of fuses. The operating and junction breakdown voltages of the latest semiconductor manufacturing processes and those in development continue to decrease. Fuses requiring high programming currents and voltages, or thick gate oxides for reliable operation, are therefore not viable for use in many of the newest integrated circuit devices. Thus, new fuses are being developed to be compatible with the constraints of new and upcoming processes.

Another issue arises because of the smaller geometries provided by new and upcoming process technologies. Smaller geometries include smaller line widths and device sizes. At reduced geometries, the resistance of the fuse device is more difficult to control. In some cases, the difference in resistance between a burned fuse and an unburned fuse may be so small that the difference is difficult to detect with prior fuse sensing circuits.

Fuses having a lower programming current may have a wide range of programmed resistance values as compared to their unprogrammed resistance values. Further, the change in resistance of such fuses from the unprogrammed to the programmed state may be as small as 1.5×for one type of fuse. A low post-burn resistance creates difficulties in sensing the state of a fuse, particularly for a low voltage CMOS process, for example. Merely increasing sensing current to increase sensing sensitivity is not a viable approach. If the current through an unprogrammed fuse is not low enough during sensing, the unprogrammed fuse may be erroneously programmed.

Prior fuses and fuse sensing circuits present another disadvantage where lower voltage processes are used. As processes move to lower supply voltages, the voltage available to program fuses also inherently decreases. As the fuse programming voltage is lowered, the number of "marginally burned" fuses increases. Fuses are considered to be marginally burned when, after programming, the resistance of the fuse remains low enough that there is an unacceptable risk that the fuse might be identified as being unprogrammed when its state is sensed. Therefore, marginally burned fuses may compromise the functionality or quality of the circuit that uses the fuse. This is particularly true where the state of a single fuse determines the state of a fuse-based storage cell. Additional or redundant fuses have previously been provided for this type of cell, but each redundant fuse takes up valuable space on the integrated circuit die. Further, redundancy may still not provide adequate yield for some processes.

Thus, fuses having low programming currents, and/or fuses that exhibit a small change in resistance between an unburned state and a burned state, can present difficulties in terms of providing a safe and reliable fuse-based storage cell.

One type of prior fuse-based storage cell, for example, includes a pair of fuses forming one side of a four resistor bridge circuit. The opposite side is formed by two reference resistors. One fuse device is programmed if one circuit state is desired (a logical "1", for example), and the opposite fuse device is programmed if the opposite state is desired. For low voltage CMOS processes, however, when sensing the state of this type of circuit, the programmed state of one of the fuses can cause the current through the other fuse device to become high enough to program or partially program the unprogrammed device. In this manner, sensing the states of fuses can cause the circuit including the fuses to become unreliable.

Another type of sensing circuit uses a predetermined, non-variable resistance to establish a reference voltage in one branch of a sensing circuit. The state of a fuse in another branch of the sensing circuit is then identified by determining whether a voltage in the second circuit branch is higher or lower than the reference voltage. Examples of such circuits are described in U.S. Pat. No. 4,730,129 to Kunitoki et al. and U.S. Pat. No. 5,384,746 to Giolma. A disadvantage of this arrangement is that, in low voltage CMOS processes, for example, the distribution of post-burn fuse resistances can be very wide. The sensitivity of this type of circuit decreases with a lower supply voltage and may result in a lower yield or even lower reliability.

Other types of prior fuse sensing circuits have poor controllability and thus, rely on tight manufacturing controls to ensure a predictable output state during sensing. In this case, manufacturing variations can cause the output produced during fuse sensing to be indeterminate, and therefore, unreliable. For this reason, while maintaining a low sensing current and voltage, it is also important to ensure reliable measurement by compensating for variations that can cause anomalous sensing at low voltage levels.

This can be an issue particularly in the case of CMOS integrated circuit devices, where it is difficult to directly and reliably sense signals below about 100 mV due to random and systematic variations in device threshold voltages (Vt) and effective channel lengths (Le). Further, prior fuse sensing circuits having poor controllability also have the potential to create unsafe currents for a fuse having a low programming current.

SUMMARY OF THE INVENTION

A fuse-based storage cell is disclosed. The fuse-based storage cell comprises a first circuit branch including a first fuse and a second circuit branch including a second fuse, the second circuit branch being coupled to the first circuit branch in a current mirror configuration. An output node coupled to the first circuit branch and responsive to a sense enable signal indicates a logical "1" if the first fuse is programmed and the second fuse is unprogrammed or a logical "0" if the first fuse is unprogrammed and the second fuse is programmed.

Other features and advantages of the present invention will be apparent from the accompanying drawings and from the detailed description that follows below.

BRIEF DESCRIPTION OF THE DRAWINGS

The present invention is shown by way of example and not limitation in the figures of the accompanying drawings, in which like references indicate similar elements, and in which.

DETAILED DESCRIPTION

Figure 1:
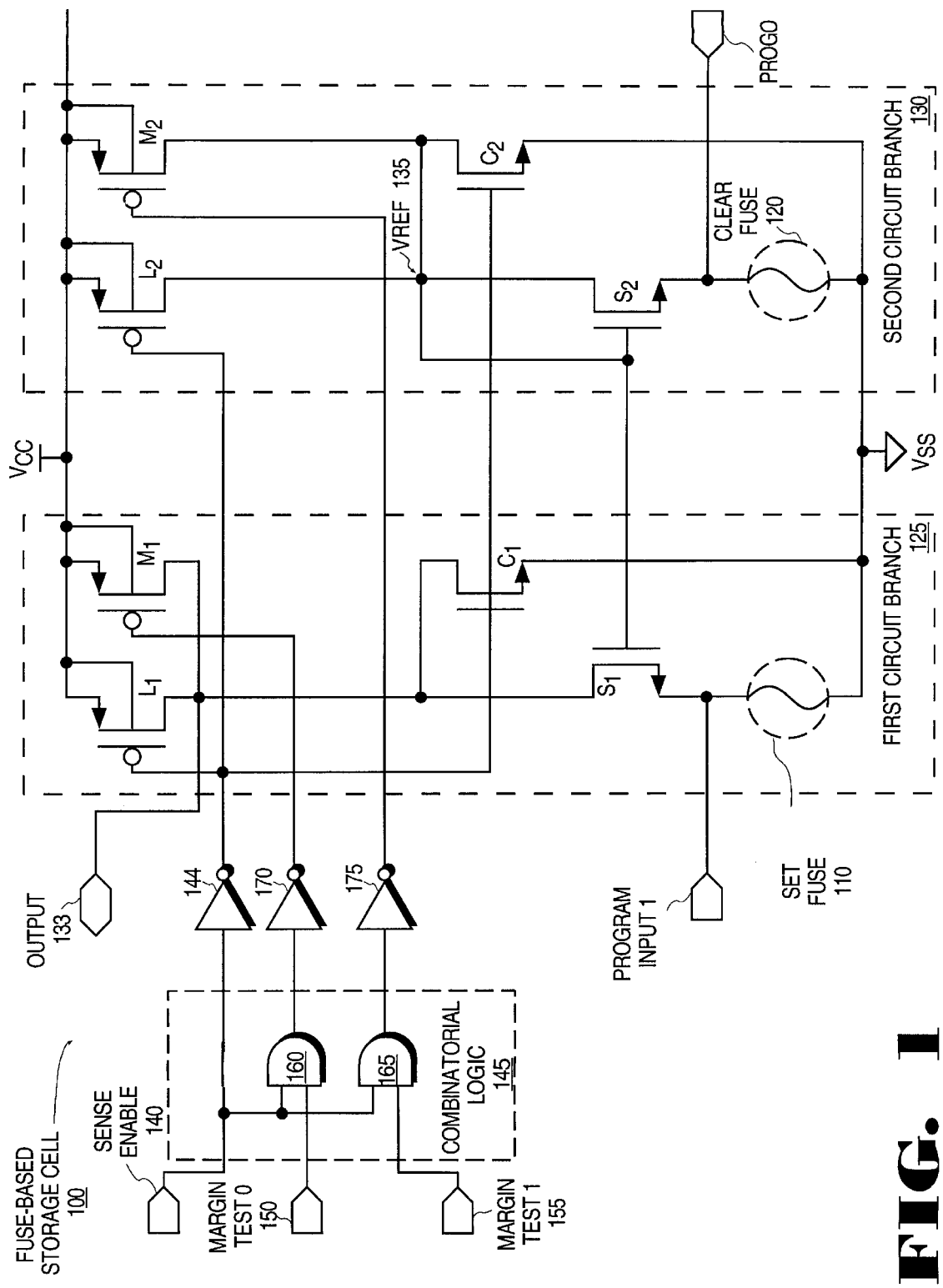
FIG. 1 shows a fuse-based storage cell of one embodiment.

A static, high-sensitivity fuse-based storage cell is disclosed. An intended advantage of one or more embodiments described below is a potential increase in storage cell yield due to a reduction in fuse failures that are caused by marginally programmed fuses. Other intended advantages of one or more embodiments described below may include a reduction in the amount of space required on an integrated circuit for fuse-based storage cells.

As will be described in more detail below, the fuse-based storage cell of one embodiment includes a first circuit branch including a first fuse referred to herein as a "set" fuse and a second circuit branch including a second fuse referred to herein as a "clear" fuse. The first circuit branch and the second circuit branch are coupled together in a current mirror configuration. The set and clear fuses are so called because an output node coupled to the first circuit branch indicates a logical "1" if the set fuse is programmed and the clear fuse is unprogrammed or a logical "0" if the clear fuse is programmed and the set fuse is unprogrammed. The set fuse and the clear fuse may be alternately referred to as the "output high" fuse and the "output low" fuse, respectively.

The high-sensitivity, low read current, fuse-based storage cell 100 of one embodiment is described in more detail with reference to FIG. 1. The fuse-based storage cell 100 includes two branches: a first circuit branch 125 including a set fuse 110 and a second circuit branch 130 including a clear fuse 120. The first circuit branch 125 and the second circuit branch 130 are coupled together in a current mirror configuration.

For one embodiment, the set fuse 110 and the clear fuse 120 are a same type of fuse and are matched in lithography, orientation, materials and processing. In this manner, they have resistances similar to each other when they are both in a same state, and they vary in the same manner in response to similar conditions.

Examples of fuses that may be used as the set fuse 110 and clear fuse 120 are described in copending U.S. patent application Ser. No. 08/769,152, entitled "A Silicide Agglomeration Fuse Device with Notches to Enhance Programmability," filed Dec. 18, 1996 (Attorney Docket No. 42390.P3783X), and U.S. patent application Ser. No. 08/537,283, entitled "A Silicide Agglomeration Fuse Device," filed Sep. 29, 1995 (Attorney Docket No. 42390.P3064), both assigned to the assignee of the present invention. Other types of fuses, particularly those that are programmed using low current levels, may also be used in the fuse-based storage cells of various embodiments.

As shown in FIG. 1, one terminal of the set fuse 110 is coupled to ground (Vss) and the opposite terminal of the set fuse 110 is coupled to a program input PROG1 to enable discretionary programming of the set fuse 110. Similarly, the clear fuse 120 has one terminal coupled to ground and an opposite terminal coupled to a program input PROG0 to enable discretionary programming of the clear fuse 120. The PROG1 and the PROG0 inputs are each coupled to a fuse programming circuit (not shown in FIG. 1).

Figure 2:
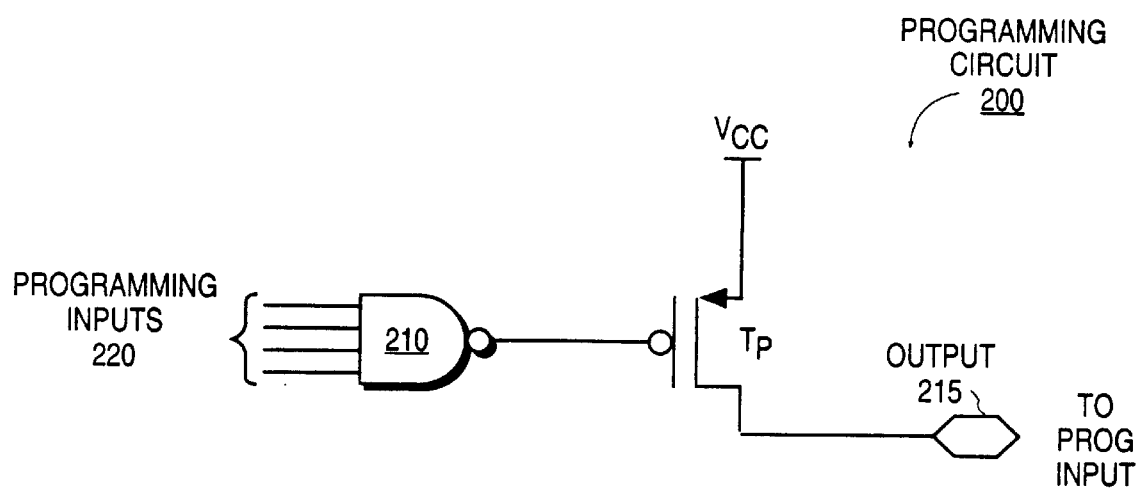
FIG. 2 shows a programming circuit that may be used to program the fuses of the fuse-based storage cell of FIG. 1.

FIG. 2 shows an example of a programming circuit 200 that may be coupled to each of the PROG1 and PROG0 inputs and used to program the set fuse 110 or the clear fuse 120 shown in FIG. 1. The programming circuit 200 includes a programming device Tp having its source coupled to a supply voltage Vcc. The programming device Tp is relatively large such that it has a low drain to source voltage (Vds). The low drain to source voltage of Tp provides for a higher voltage across the fuse to be programmed during programming.

Vcc in this case can alternately be referred to as Vpp because the same supply voltage is applied to the fuse-based storage cell 100 during programming of the set and/or clear fuses for one embodiment. For another embodiment, Vpp may be slightly higher Vcc, but still within the tolerance of the supporting circuitry.

Logic such as a NAND gate 210 is coupled to the gate of the transistor Tp to control the programming circuit 200 of one embodiment. The NAND gate 210 is located very close to the transistor Tp on the integrated circuit device in which they are both formed. In this manner, the effects of noise and other anomalies that increase over signal line length are reduced. Similarly, the risk of an anomalous signal turning on the programming transistor Tp and inadvertently programming a fuse coupled to the programming circuit is also reduced.

Programming of a fuse coupled to the drain of the programming transistor Tp at an output 215 is controlled through one or more programming input lines 220. If only one programming input line is used, the NAND gate 210 or another logic gate is not necessary. In this example, inputs received on the programming input lines 220 that result in a low signal at the gate of the transistor Tp will turn the transistor Tp on. Turning the transistor Tp on causes current to flow through a fuse coupled to the output 215 thereby programming the fuse, assuming the current is high enough.

The size of the programming circuit 200 is kept small by coupling one end of the fuse to be programmed to ground (as shown in FIG. 1) such that only one p-channel transistor is required. For alternative embodiments of the fuse-based storage cell in which devices, signals, configurations and voltage supplies are complementary to those shown in FIG. 1, the programming circuit may include an n-channel transistor with complementary signals. In this manner, a fuse device coupled to the output 210 is programmed when the n-channel transistor is turned on. Other programming circuits may also be used to program the fuses 110 and 120 of the fuse-based storage cell 100.

Referring back to FIG. 1, one terminal of the set fuse 110 is also coupled to the source of a sense enable device S1 that is also part of the first circuit branch 125. The drain of the sense enable device S1 is coupled to the drain of a load device L1, the drain of a margin testing device M1 and the drain of an output clamping device C1. An output node 133 is also coupled to the drain of the sense enable device S1.

The second circuit branch 130 includes a sense enable device S2 having a source coupled to one terminal of the clear fuse 120. The drain of the sense enable device S2 is coupled to the drain of each of a load device L2, a margin testing device M2, and an output clamping device CR in a similar manner as described with reference to corresponding components in the first circuit branch 125. The second circuit branch 130 also includes a reference voltage node Vref 135 discussed in more detail below. The sources of each of the load devices L1 and L2 and each of the margin test devices M1 and M2 are coupled to a voltage source Vcc as shown in FIG. 1.

The gates of the sensing devices S1 and S2 are coupled together and the gate of S2 is coupled to its drain at the node 135. In this manner, a current mirror configuration is established between devices S1 and S2 and therefore, between the first circuit branch 125 and the second circuit branch 130.

For one embodiment, in order to increase the sensitivity of the fuse-based storage cell 100 such that very small changes in the resistance of the set fuse 110 or the clear fuse 120 can be detected, corresponding devices in the first circuit branch 125 and the second circuit branch 130 (i.e. L1 and L2, C1 and CR, S1 and S2 and M1 and M2) are matched as closely as is practical and in as many ways as is practical.

Matching the corresponding devices in the sensing and second circuit branches for one embodiment, for example, includes matching orientation of the devices on the semiconductor chip, materials and process used to manufacture the devices, lithography (including size) and surrounding structures or circuitry. In this manner, L1 and L2, for example, will vary in response to changes in manufacturing tolerances, temperature, processing variations or other conditions in a similar manner to each other.

The sizes of each of the devices in the fuse-based storage cell 100 depends on many factors including the particular process used to fabricate the circuit, the characteristics of the fuses that are to be sensed, the desired sensitivity of the fuse-based storage cell and the area available for the fuse-based storage cell, for example. Numerical optimization may be used to arrive at the device sizes for a particular process, fuse, desired sensitivity, area constraint, or to meet other criteria. For one embodiment, numerical optimization is performed with the goals to 1) provide a "safe" sensing current, i.e. one that will not erroneously program an unprogrammed fuse, and 2) maximize, to the extent possible, the differential output voltages, i.e. maximize Voh, and minimize Vol.

Having the set and clear fuses in opposite states for either stored logic value as described in more detail below also contributes to the sensitivity of the fuse-based storage cell 100. With the high sensitivity of the fuse-based storage cell 100, it is an intended advantage of one or more embodiments to increase the yield of usable fuse-based storage cells by decreasing the number of cells that are considered marginally programmed and, therefore, failures.

With continuing reference to FIG. 1, the gates of the load devices L1 and L2 and the output clamping devices C1 and CR are coupled to receive a sense enable signal on a sense enable input 140 through an inverter 144. Combinatorial logic 145 in cooperation with signals received on the sense enable input 140, a margin test 0 input 150 and a margin test 1 input 155 act to control operation of the fuse-based storage cell 100 as described in more detail below. The combinatorial logic 145 operates at the supply voltage Vcc and includes AND gates 160 and 165. Different combinatorial logic may be used for different embodiments.

The AND gate 160 has one input coupled to receive a sense enable signal from the sense enable input 140 and another input coupled to receive a margin test 0 signal from the margin test 0 input 150. The output of the AND gate 160 is coupled to the input of an inverter 170 that has its output coupled to the gate of margin test transistor M1. The AND gate 165 has one input coupled to receive a sense enable signal from the sense enable input 140 and another input coupled to receive a margin test 1 signal from the margin test 1 input 155. The output of the AND gate 165 is coupled to the input of an inverter 175 that has its output coupled to the gate of the margin test transistor M2 in the second circuit branch 130. The AND gates 160 and 165 are used for one embodiment to prevent the fuse-based storage cell 100 from being enabled unless a sense enable signal on the sense enable input 140 is asserted. Thus, the states of the margin test inputs 150 and 155 are irrelevant to whether the fuse-based storage cell 100 is enabled.

The inverters 144, 170 and 175 are complementary metal oxide semiconductor (CMOS) inverters such that the voltage swing on the output of the inverters is essentially "rail-to-rail" from Vcc to Vss. The voltage swing on the output of the inverters 144, 170 and 175 helps to control operation of the fuse-based storage cell 100 to reduce leakage when the circuit 100 is not enabled, and increase the sensitivity of the fuse-based storage cell 100. Further, the inverters 144, 170 and 175 are local to the first circuit branch 125 and the second circuit branch 130 to ensure that the signal applied to the gate of the load devices L1 and L2 is effectively shorted to the local supply Vcc. For example, if the sense enable signal received by the sense enable input 140 includes noise, ringing or signal droop, the inverter 144 helps to provide a "cleaner" signal to the gate of the load device L1. For alternative embodiments, the inverters may not be used.

For the embodiment discussed with reference to FIG. 1, the sense enable signal received on the sense enable input 140 is active high. When the sense enable signal received at the sense enable input 140 is not asserted, the CMOS inverter 144 provides a high output signal essentially equivalent to Vcc, and the MOS p-channel load-devices L1 and L2 are turned off. In this manner, there is no current flow through the first and second circuit branches 125 and 130 and the fuse-based storage cell 100 is turned off.

The output of the inverter 144 is also coupled to the gates of the output clamping devices C1 and C2 for one embodiment such that when the sense enable signal is not asserted, the n-channel output clamping devices C1 and C2 are turned on. When the output clamping devices C1 and C2 are turned on, current flows through the output clamping devices C1 and C2 clamping the voltage at the output node 133 to Vss in the embodiment shown in FIG. 1. In this manner, the output node 133 is taken to a known state when the fuse-based storage cell 100 is not enabled.

The output clamping devices C1 and C2 also help to ensure that other devices (not shown) coupled to the output node 133 of the fuse-based storage cell 100 do not receive an input potential in a range that would partially turn such devices on. In this manner, devices coupled to the fuse-based storage cell 100 do not draw power when the fuse-based storage cell 100 is not enabled. This assumes that such devices do not draw static current with an active low signal, or if they do, appropriate combinatorial logic is provided between the fuse-based storage cell output node 133 and succeeding circuits.

The sense enable signal on the input 140 and the combinatorial logic 145 also operate together to control the operation of margin testing gates M1 and M2. A low signal on the sense enable input 140 produces a high signal on the output of the inverters 170 and 175 coupled to the AND gates 160 and 165. This causes the p-channel devices M1 and M2 to be turned off such that they also do not draw power when the circuit is not enabled.

For an alternative embodiment, the fuse-based storage cell includes devices, signals, configurations and voltage supplies that are complementary to those shown in FIG. 1. For example, for such embodiments, the set and clear fuses have one end coupled to Vcc, n-channel devices are replaced by p-channel devices and vice versa, active high signals are replaced by active low signals (or additional inverters are used), and the combinatorial logic may be changed appropriately.

The operation of the fuse-based storage cell 100 is now described with continuing reference to FIG. 1. For one embodiment, the sense enable signal received on the sense enable input 140 is responsive to a reset signal from an external source. For an alternative embodiment, the sense enable signal may be responsive to another type of initializing signal. Other types of non-initializing signals such as a read/access signal to read data on demand or a load signal, for example, can also be used to enable the fuse-based storage cell 100.

As the sense enable signal on the input 140 transitions from a low to a high state (i.e. an asserted state) upon reset, the MOS load transistors L1 and L2 are turned on. Turning device L2 on, creates a current path between the voltage supply Vcc and the sensing device S2 of the second circuit branch 130 pulling the gate of the sensing device S2 up, causing it to conduct. As the sensing device S2 is turned on, the sensing device S2 limits the voltage at node Vref 135 from being pulled all the way to the supply voltage Vcc, thus establishing a reference voltage at the node Vref 135. In this manner, the fuse-based storage cell 100 is "self-biased". The reference voltage Vref 135, however, is dynamic in that it changes in response to the logic value stored by the fuse-based storage cell 100. The dynamic nature of the reference voltage Vref 135 contributes to the sensitivity of the fuse-based storage cell 100 as described in more detail below.

For purposes of example, it is first assumed that it is desirable for the fuse-based storage cell 100 to store a logical 1. That is, it is desirable to have a voltage or potential on the output node 133 within the first range such that it is interpreted as a single-ended logical "1" (Voh) by succeeding logic (not shown) coupled to the output node 133. In accordance with one embodiment, this is accomplished by programming or burning the set fuse 110 in the manner described above, and leaving the clear fuse 120 unprogrammed.

Depending on the particular types of fuses used, process variations and other factors, there may be a wide range of variation in fuse post-burn resistance. The behavior of the fuse-based storage cell 100 in response to burning the set fuse 110 depends on the amount of change in the resistance of the set fuse 110 from the unprogrammed to the programmed state as described below.

First, if the change in the resistance of the set fuse 110 from the unprogrammed to the programmed state is small (in the range of about 1.5–10 times greater for one embodiment), then a small signal analysis is used to explain the operation of the fuse-based storage cell 100. Following programming of the set fuse 110, the clear fuse 120 has a lower resistance than the programmed set fuse 110. The clear fuse 120 therefore, sets a bias current in the second circuit branch 130 and a bias voltage at the node Vref 135.

The gates of S1 and S2 are coupled together and are therefore at the same voltage. When the set fuse 110 is burned, a higher potential is created on the source of the sense enable device S1 based on the higher resistance of the set fuse 110. The higher potential on the source of the sense enable device S1 relative to the source of S2 narrows the gap between the source and gate potentials, or "pinches" the Vgs of the sense enable device S1. The current flowing through the sense enable device S1 is thus, also reduced. The load device L1 of the first circuit branch 125 then pulls up the potential of the output node 133 to a high state, i.e. a Voh sufficiently high to trip succeeding logic (not shown) that is coupled to the output node 133.

In addition to the first order effect described above caused by burning the set fuse 110, there is also a second order reduction in the output voltage (Voh in this case) due to reduced current in the first circuit branch 125. The first order effect, however, dominates such that at equilibrium, the resulting potential at the output node 133 is only slightly lower than the "ideal"Voh that is achieved if only the first order effect is taken into consideration.

Thus, as described above, if the set fuse 110 is programmed and the clear fuse 120 is unprogrammed, the voltage on the output node 133 will be within the first voltage range indicating a single-ended logical "1". Any voltage on the output node 133 within this range indicates that the set fuse 110 is programmed and is interpreted as a single-ended logical "1".

The actual readout voltages at the output node 133 that indicate the programmed or unprogrammed state of the set fuse 110 depend on many factors including the Vcc supply voltage of the fuse-based storage cell 100, and the resistances of the fuses 110 and 120 in the programmed and unprogrammed state.

Where the resistance of the programmed set fuse 110 is very high in comparison to its unprogrammed resistance, the operation of the fuse-based storage cell 100 is explained using a large signal model. In this case, little to no current flows through the set fuse 110 following programming. The output node 133 is therefore pulled high (effectively to Vcc) by the load device L1 to a voltage in a range indicating a single-ended logical 1. In this case, because there is virtually no current flowing in the first circuit branch 125, the sensing device S1 is not sensitive to a potential on the node Vref 135. The operation of the first circuit branch 125 can therefore be explained by basic open circuit principles and not by current mirror operation.

The logical 1 output voltage Voh on the output node 133, with respect to the post-burn resistance of the set fuse 110, is continuous and monotonically increasing from small to large signal operation. In other words, the higher the post-burn resistance of the set fuse 110, the higher the output high voltage (Voh) at the output node 133 limited by Vcc.

Next, it is assumed for purposes of illustration that it is desirable for the fuse-based storage cell to store a logical 0.

Thus, it is desirable to have a voltage on the output node 133 within the second range such that it is interpreted as a single-ended logical "0" (Vol) by logic (not shown) coupled to the output node 133. This is accomplished by programming the clear fuse 120 in the manner described above, and leaving the set fuse 110 unprogrammed.

As described above, where the change in the resistance of the clear fuse from the unprogrammed state to the programmed state is relatively small (e.g. 1.5–10 times for one embodiment), a small signal model is used to describe the operation of the fuse-based storage cell 100. When the clear fuse 120 is burned, its resistance increases such that the potential difference across the clear fuse 120 is increased. As a result, the potentials at the source of the sensing device S2 and at the node Vref 135 both increase. The change in the potential at the node Vref 135 increases the potential on the gates of the sensing devices S2 and S1. The gate to source voltage (Vgs) of the sensing transistor S1 is thus increased causing more current to flow in the first circuit branch 125. The combination of the higher current in the first circuit branch 125 and the on resistance of the load device L2 causes the voltage at the output node 133 to drop to a level (Vol) at which a single-ended logical 0 is detected by succeeding logic (not shown) coupled to the output node 133. The potential on the output node 133 should, at this point, be within the second voltage range indicating that the clear fuse 120 is programmed and the set fuse 110 is unprogrammed.

As described above with respect to programming the set fuse 110, in addition to the first order effect described above, there is also a competing, but lesser effect as the fuse-based storage cell 100 reaches equilibrium following programming of the clear fuse 120. A reduction in the second circuit branch 130 current slightly reduces the voltage drop across the clear fuse 120. The voltage at the node Vref 135 and thus, the voltage on the gate of S1 are reduced thereby elevating the voltage Vol on the output node 133 above an ideal Vol determined by the first order effect alone. For some technologies, particularly non-submicron technologies, the output low voltage Vol may also be affected by the dynamic on-resistance of the load device L1.

Finally, where the change in the resistance of the clear fuse 120 from an unprogrammed state to a programmed state is very large, a large signal model is used to describe the operation of the fuse-based storage cell 100. In this case, following programming of the clear fuse 120, effectively no current flows in the second circuit branch 130. The node Vref 135 is pulled high by the load device L2 such that the gate of the sensing device S1 is taken effectively to Vcc. The current through the first circuit branch 125 is thus increased and the potential at the output node 133 is pulled down close to Vss to indicate a single-ended logical 0 (Vol).

The logical 0 output voltage Vol on the output node 133, with respect to post-burn resistance of the clear fuse 120, is continuous and monotonically decreasing from small to large signal operation. In other words, the lower the post-burn resistance of the clear fuse 120, the lower the output low voltage (Vol) at the output node 133 limited by a voltage slightly above Vss.

With continuing reference to FIG. 1, the logical value stored by the fuse-based storage cell 100 may be sensed in either a single-ended or differential configuration. In a single-ended configuration, the output node 133 is directly coupled to the input of succeeding logic (not shown). In this case, the value stored by the fuse-based storage cell 100 may be determined by comparing the voltage on the output node 133 to the trip point(s) of the succeeding logic.

In a differential sensing configuration, the output node 133 and the node Vref 135 form a differential output signal pair. The differential outputs can be coupled to a differential amplifier to amplify the signals on the outputs. The differential sensing configuration may be used, for example, where the post-burn resistance of fuses is uniformly low and/or transistor gain is uniformly low.

One embodiment of the fuse-based storage cell 100 also provides for manufacturing programming verification. Using the fuse-based storage cell 100 of one embodiment, it is possible to test the margin of the set and/or clear fuse devices 110 and 120 to identify partially burned fuses, unacceptable variations in the fuses, or other marginal conditions that may make the fuse-based storage cell 100 unreliable. Such conditions may arise, for example, if sensing the value stored by the fuse-based storage cell 100 under nominal conditions yields the correct value stored, but a "false read" could occur due to aging, noise, thermal, or other environmental conditions. The margin mode testing circuits of one embodiment are designed to attempt to instigate the false read during a verification process. In this manner, field failures due to such issues may be reduced.

The margin-mode testing features of the fuse-based storage cell 100 of one embodiment are described with continuing reference to FIG. 1. Margin mode testing devices M1 of the first circuit branch 125 and M2 of the second circuit branch 130 enable margin testing of the fuse devices 110 and 120, by upsetting the balance between the matched load devices, L1 of the first circuit branch 125, and L2 of the second circuit branch 130.

It will be appreciated that because the margin mode testing devices M1 and M2 are used to detect small differences in fuse resistance from an unprogrammed to a programmed state, a small signal analysis is appropriate to explain the operation of the fuse-based storage cell 100 when a margin mode is enabled.

The drain of the p-channel margin mode testing device M1 is coupled to the drain of the sense enable device S1. Similarly, the drain of the p-channel margin mode testing device M2 is coupled to the drain of the sense enable device S2. The margin mode testing capabilities of the fuse-based storage cell 100 are controlled in one embodiment using the sense enable input 140, a margin test 0 input 150 and a margin test 1 input 155 in cooperation with the combinatorial logic 145 as discussed above.

It will be appreciated by those of skill in the art, that where symmetric devices are used, the sources and drains of each of the devices described above may be reversed.

The margin test 0 input 150 is coupled to one input of the AND gate 160 having an output coupled to the inverter 170, which has an output coupled to the gate of the margin mode testing device M1. Another input of the AND gate 160 is coupled to the sense enable input 140.

The margin test 1 input 155 is coupled to one input of the AND gate 165 having an output coupled to the inverter 175, which has an output coupled to the gate of the margin mode testing device M2. The other input of the AND gate 165 is similarly coupled to the sense enable input 140.

A logically high signal on the margin test 1 input 155 along with a high signal on the sense enable input 140 turns on margin test mode device M2 to initiate a first margin test mode. Turning on the margin test mode device M2 slightly increases the current flow in the second circuit branch 130, and, because of the current mirror configuration, the current flow in the first circuit branch 125 also increases. In this manner, the output potential at the output node 133 is depressed.

Thus, if the output node 133 indicates that the fuse-based storage cell 100 stores a logical 1 and the fuse-based storage cell 100 is marginal, the first margin testing mode will cause the voltage at the output node 133 to drop below the first range. Depending on the extent of the drop in voltage on the output node 133, for one embodiment, the fuse-based storage cell 100 will be identified as a failure, or as being marginal. A marginal fuse-based storage cell detected by the first margin test mode may be caused by a marginally programmed set fuse or other storage cell defects. If the fuse-based storage cell 100 stores a logical 1 but is not marginal, the voltage at the output node 133 will still be in the first voltage range during margin testing.

A second margin test mode is used to detect whether the fuse-based storage cell 100 is marginal after being identified as storing a logical 0. A high signal on the margin test 0 input 150 along with a high signal on the sense enable input 140 turns on the p-channel margin mode test device M1. Turning on the device M1 decreases the resistance of the margin mode test device M1 and thus, pulls up the output potential on the output node 133.

If the fuse-based storage cell 100 was identified as storing a logical 0 when enabled, but is marginal, the output potential on the output node 133 will increase enough that it will be above the second range in which a logical 0 is indicated. The fuse-based storage cell 100 is then identified as being marginal or a failure for one embodiment depending on the amount by which the voltage on the output node 133 increases. A marginal fuse-based storage cell identified by the second margin test mode may be due to a marginally programmed clear fuse or another defect in the fuse-based storage cell. If the fuse-based storage cell 100 is not marginal, the amount by which the voltage level at the output node 133 is raised during margin testing will not be enough to take the voltage level at the output node 133 out of the second range. In this manner, the fuse-based storage cell 100 of one embodiment has an intended advantage of reducing field failures due to marginally programmed fuse devices or other defects that cause the fuse-based storage cell to be marginal.

The size of the margin mode testing devices M1 and M2 in comparison to the load devices L1 and L2 can be selected based on the programming characteristics of the particular set and clear fuses to be sensed or to provide a particular margin for programmed and/or unprogrammed fuses, for example. The size of the margin mode testing devices M1 and M2 in comparison to the load devices L1 and L2 may also depend on the particular process used to form the fuse-based storage cell 100 and/or the acceptable range of fuse resistance drift due to aging and/or use.

Figure 3:
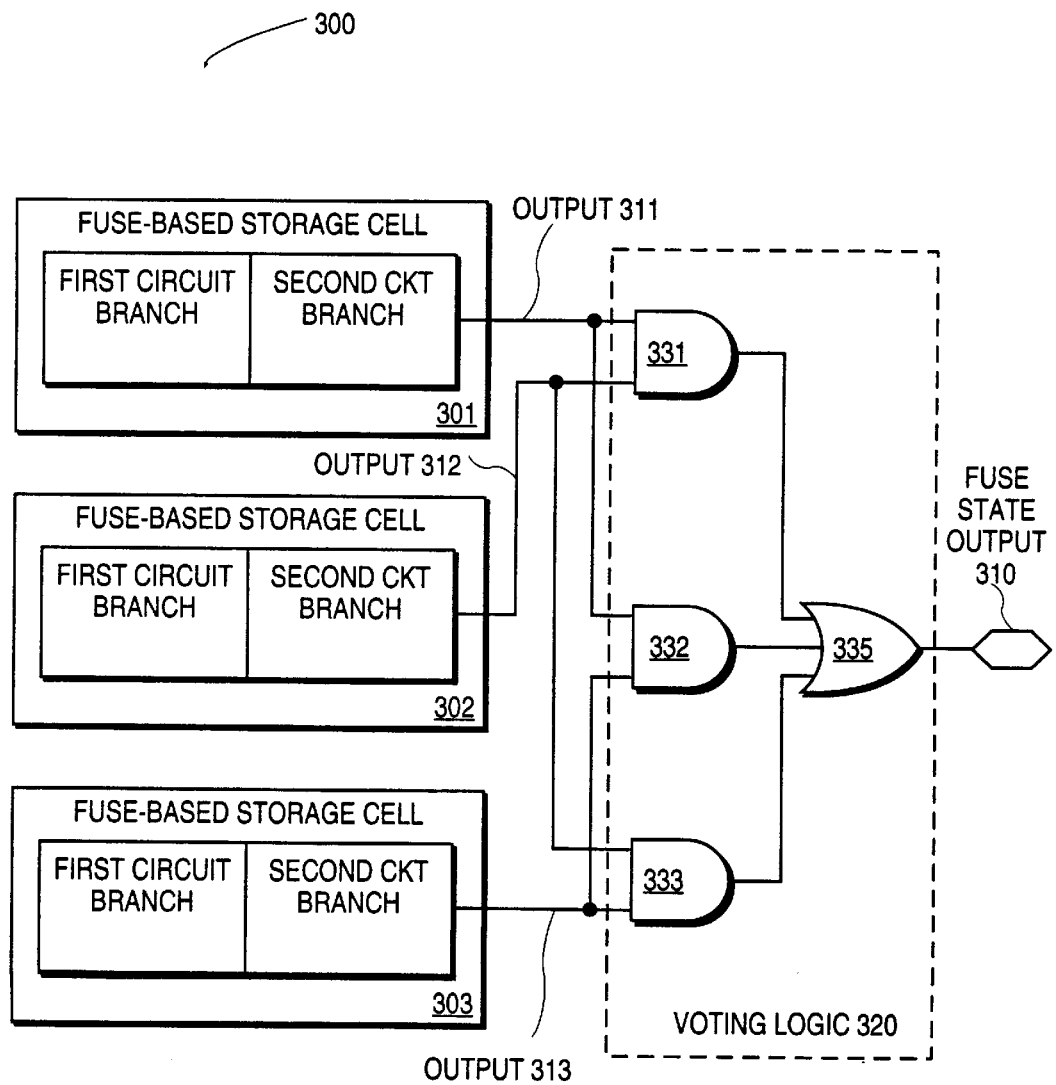
FIG. 3 shows circuitry used for one embodiment to store the state of the fuse-based storage cell of FIG. 1.

The fuse-based storage cell 100 also has an intended advantage of reducing the need for redundant fuses by increasing the sensitivity of the fuse-based storage cell 100. Where increased fault tolerance is desired, however, the fuse-based storage cell 100 can be easily configured along with other similar fuse-based storage cells to provide for redundancy. FIG. 3 shows one example of how a redundant set of fuse devices 300 according to one embodiment may be arranged.

The set of redundant fuse-based storage cells 300 of FIG. 3 includes three fuse-based storage cells 301–303, similar to the fuse-based storage cell 100 of FIG. 1. Each of the fuse-based storage cells 301–303 includes a first circuit branch including a set fuse and a second circuit branch including a clear fuse (not shown) as for the fuse-based storage cell 100 (FIG. 1). Each of the fuse-based storage cells 301–303 also includes an output node 311–313, respectively, similar in function to the output node 133 of the fuse-based storage cell 100 of FIG. 1.

The output nodes 311–313 of each of the fuse-based storage cells 301–303 are coupled to the voting logic 320. For one embodiment, the voting logic 320 includes three AND gates 331–333 and a three-input OR gate 335. The AND gate 331 has a first input coupled to the output node 311 of the fuse-based storage cell 301 and a second input coupled to the output node 312 of the fuse-based storage cell 302. The AND gate 332 has a first input coupled to the output node 311 of the fuse-based storage cell 301 and a second input coupled to the output node 313 of the fuse-based storage cell 303. The AND gate 333 has a first input coupled to the output node 312 of the fuse-based storage cell 302 and a second input coupled to the output node 313 of the fuse-based storage cell 303. Each of the three inputs of the OR gate 335 is coupled to an output node of a different one of the AND gates 331–333. The output node of the voting logic 320 (which is the output node of the OR gate 335) is the fuse-based storage cell state output node 340.

In the redundant fuse array 300 of FIG. 3, a potential on the output node 340 indicates the logical value stored by a majority of the fuse-based storage cells 301–303. Thus, if at least two of the fuse-based storage cells 301–303 are identified as storing a logical 1 in the manner described above with reference to FIG. 1, then the potential on the fuse state output node 340 will indicate a logical 1 for the set 300 of fuse-based storage cells of FIG. 3. The set 300 of fuse-based storage cells can be implemented with any odd number of fuse-based storage cells and with a corresponding change in the voting logic 320. For other embodiments, the voting logic may be configured in another manner.

Figure 4:
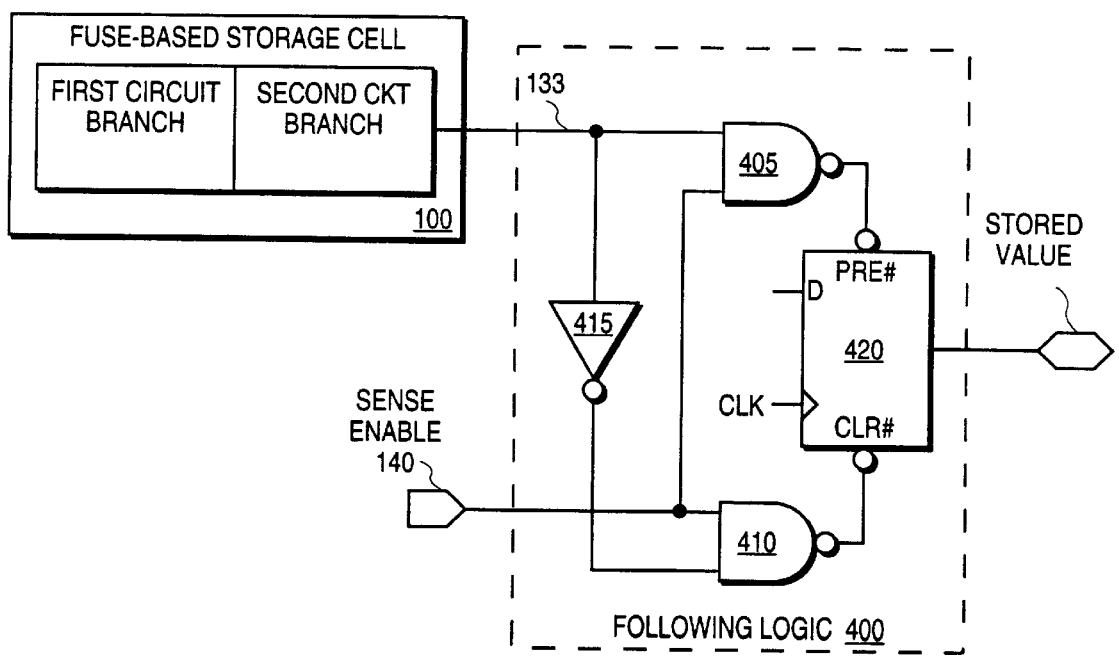
FIG. 4 shows one example of a redundant storage cell arrangement using multiple fuse-based storage cells similar to the fuse-based storage cell of FIG. 1.

FIG. 4 shows one example of following logic 400 that may be coupled to the output node 133 of the fuse-based storage cell 100 of FIG. 1 in order to latch the value stored by the fuse-based storage cell 100. Alternatively, the following logic 400 may be coupled to the output node 340 to latch the output state of the set 300 of redundant fuse-based storage cells. Thus, the value stored by fuse-based cell(s) may be latched during operation of a device including the fuse-based cell(s). In this manner, the fuse-based cell(s) do not have to be powered and/or enabled once the state is latched.

The following logic 400 includes a first NAND gate 405 having a first input coupled to the output node 133 and a second input coupled to a first input of a second NAND gate 410 and to the sense enable input node 140 (FIG. 1). The second input of the NAND gate 410 is coupled to the output node 133 through an inverter 415. The output of the first NAND gate 405 is coupled to the preset (PRE#) input of an edge-triggered flip-flop 420, and the output of the second NAND gate 410 is coupled to the clear (CLR#) input of the flip-flop 420. PRE# and CLR# inputs are asynchronous in the embodiment shown in FIG. 4, but may be synchronous in other embodiments. The flip-flop 420 also receives a clock input and may receive the output of another set or array of fuse-based storage cells on the data input such that fuse-based storage cell arrays may be cascaded, and the state of each may be read serially for purposes such as verification, etc.

A reset or other predetermined signal to the fuse-based storage cell 100 asserts the sense enable signal 140. The potential indicating the logical value stored by fuse-based storage cell 100 is provided at the output node 133 and both the logical value (in the form of a potential on the output node 133) and the sense enable signal 140 are provided to the NAND gates 405 and 410 (the signal from the output node 133 being logically inverted before reaching the NAND gate 410). If the fuse-based storage cell 100 stores a logical "1", the output signal of NAND gate 405 is low, and the PRE# signal is asserted. Conversely, if the fuse-based storage cell stores a logical "0", the output signal of NAND gate 410 is low, and the CLR# signal is asserted. In this manner, the value stored by the fuse-based storage cell 100 can be stored in the flip-flop 420, and later scanned or otherwise used internally. The value stored by a redundant array is determined in a similar manner. Other types of latch circuits or flip-flops may be used to perform a similar function. Further, the following logic of some embodiments may be coupled to a different power supply than the fuse-based storage cell 100.

The fuse-based storage cell of the embodiments described herein has the intended advantage of providing safe and reliable sensing of the logical value therein, while preventing erroneous programming of unprogrammed fuse devices, including fuse devices having low programming currents. The static nature of the fuse-based storage cell of one or more embodiments also has the feature that no special timing circuitry is required.

For one embodiment, matching all corresponding devices in the first and second circuit branches of the fuse-based storage cell helps to increase the tolerance of the fuse-based storage cell to variations in manufacturing, effective channel length, etc.

Also, because the fuse-based storage cell of the embodiments described herein is operated by combinatorial logic and does not require a programming voltage higher than the operating voltage of surrounding circuitry, the fuse-based storage cell can be enabled by any desired source, including on-chip logic. Thus, the fuse-based storage cell of various embodiments does not need to be accessed by a dedicated external pin or signal for operation. In this manner, fuses can be programmed and sensed at any point during the manufacturing or operation of an integrated circuit that includes the fuse-based storage cell of such embodiments, including after packaging of the integrated circuit device. This provides the advantage that, if one or more fuse-based storage cells is used to enable a particular circuit, for example, the nature of the circuit can be changed even during use. This may be useful for purposes of increased fault tolerance, for example.

In the foregoing specification, the invention has been described with reference to specific exemplary embodiments thereof. It will, however, be evident that various modifications and changes may be made without departing from the broader spirit and scope of the invention as set forth in the appended claims. The specification and drawings are, accordingly, to be regarded in an illustrative rather than a restrictive sense.

What is claimed is:

1. A fuse-based storage cell comprising:
    a first circuit branch including a first fuse;
    a second circuit branch including a second fuse, the second circuit branch being coupled to the first circuit branch in a current mirror configuration; and
    an output node coupled to the first circuit branch and being responsive to a sense enable signal to indicate a logical "1" if the first fuse is programmed and the second fuse is unprogrammed, the output node further to indicate a logical "0" if the second fuse is programmed and the first fuse is unprogrammed.

2. The fuse-based storage cell of claim 1 wherein the first and second circuit branches each include one or more devices and wherein each device in the first circuit branch that corresponds to a device in the second circuit branch is matched to the corresponding device.

3. The fuse-based storage cell of claim 1 wherein the first and second fuses are matched to each other.

4. The fuse-based storage cell of claim 1 further including a sense enable signal line coupled to each of the first and second branches to enable the fuse-based storage cell in response to a sense enable signal on the sense enable signal line.

5. The fuse-based storage cell of claim 4 wherein the fuse-based storage cell draws substantially no current when the fuse-based storage cell is not enabled.

6. The fuse-based storage cell of claim 4 wherein the sense enable signal line is coupled to the first and second branches through one or more logic gates.

7. The fuse-based storage cell of claim 1 wherein the logical 1 is a single-ended logical 1 and the logical 0 is a single-ended logical 0.

8. The fuse-based storage cell of claim 1 wherein the second circuit branch includes a reference node and wherein the output node and the reference node form a differential sensing signal pair.

9. The fuse-based storage cell of claim 1 wherein
    the first circuit branch includes a first load device, a first clamping device and a first sensing device,
    the second circuit branch includes a second load device matched to the first load device, a second clamping device matched to the first clamping device and a second sensing device matched to the first sensing device,
    the first and second sensing devices being to coupled to provide the current mirror configuration.

10. The fuse-based storage cell of claim 1 wherein
    the first circuit branch includes a margin test device,
    the margin test device changing the potential at the output node when the margin test device is turned on, the fuse-based storage cell being identified as marginal if the first fuse is unprogrammed and the second fuse is programmed and the changed potential does not indicate a logical 0.

11. The fuse-based storage cell of claim 1 wherein
    the second circuit branch includes a margin test device,
    the margin test device changing the potential at the output node when the margin test device is turned on, the fuse-based storage cell being identified as marginal if the first fuse is programmed and the second fuse is unprogrammed and the changed potential does not indicate a logical 1.

12. The fuse-based storage cell of claim 1 wherein the first and second fuses each have one end coupled to ground.

13. An integrated circuit device that is operable at a first supply voltage, the integrated circuit device comprising:
    a first fuse-based storage cell including
        first and second matched circuit branches coupled together in a current mirror configuration, the first circuit branch including a first fuse, the second circuit branch including a second fuse, and
        a first output node coupled to the first circuit branch, the first output node being responsive to enablement of the fuse-based storage cell to indicate a logical 1 if the first fuse is programmed and the second fuse is unprogrammed, the first output node being responsive to enablement of the fuse-based storage cell to indicate a logical 0 if the second fuse is programmed and the first fuse is unprogrammed; and a gate coupled to the first and second circuit branches, the gate enabling the first fuse-based storage cell in response to a sense enable signal.

14. The integrated circuit device of claim 13 further including first and second programming circuits coupled to the first and second fuses, respectively, the first and second programming circuits operable at the first supply voltage to program the corresponding fuse.

15. The integrated circuit device of claim 13 wherein the first fuse-based storage cell is operable at the first supply voltage.

16. The integrated circuit device of claim 13 wherein the first and second fuses are programmable at the first supply voltage.

17. The integrated circuit device of claim 13 wherein the first and second circuit branches each include one or more devices, and wherein each device in the second branch that corresponds to a device in the first branch is matched to the corresponding device.

18. The integrated circuit device of claim 13 wherein the first branch includes a first margin test device and the second branch includes a second margin test device, the first margin test device changing the potential at the output node when the first margin test device is turned on, the first fuse-based storage cell being identified as marginal if the changed potential does not indicate a logical 0, the second margin test device changing the potential at the output node when the second margin test device is turned on, the first fuse-based storage cell being identified as marginal if the changed potential does not indicate a logical 1.

19. The integrated circuit device of claim 13 further including second and third fuse-based storage cells matched to the first fuse-based storage cell, the second and third fuse-based storage cells including second and third output nodes, respectively, and voting logic coupled to the first, second and third output nodes, the voting logic to indicate a logical value stored by a majority of the first, second and third fuse-based storage cells.

20. The integrated circuit device of claim 13 further including a latch coupled to the output node to latch a logical value indicated at the output node such that the fuse-based storage cell can be disabled once the logical value is latched.

21. A method for providing a digital logic value in an integrated circuit, the method comprising the steps of:

providing a first circuit branch including a first fuse and a second circuit branch including a second fuse, the second circuit branch being coupled to the first circuit branch in a current mirror configuration;

if the digital logic value to be provided is a logical 1, programming the first fuse; and if the digital logic value to be provided is a logical 0, programming the second fuse.

22. The method of claim 21 further including a step of single-endedly sensing the digital logic value.

23. The method of claim 21 further including a step of differentially sensing the digital logic value.

24. The method of claim 21 further including a step of packaging the integrated circuit prior to performing one of the steps of programming.

25. The method of claim 21 further including the step of testing for a marginal digital logic value.

26. A fuse-based storage cell comprising:

a first circuit branch including a first sensing transistor, a first fuse coupled to the first sensing transistor, a first load transistor coupled to the first sensing transistor and a first clamping transistor coupled to the first load transistor;

a second circuit branch including a second sensing transistor matched to the first sensing transistor, a second fuse matched to the first fuse and coupled to the second sensing transistor, a second load transistor matched to the first load transistor and coupled to the second sensing transistor, and a second clamping transistor matched to the first clamping transistor and coupled to the second load transistor, the first and second sensing transistors being coupled to each other in a current mirror configuration; and an output node coupled to the first load transistor and the first sensing transistor, the output node to indicate a logical 0 if the first fuse is unprogrammed and the second fuse is programmed, the output node to indicate a logical 1 if the first fuse is programmed and the second fuse is unprogrammed.

* * * * *